(12) United States Patent
Gleich et al.

(10) Patent No.: US 7,777,588 B2
(45) Date of Patent: Aug. 17, 2010

(54) TRANSMISSION PATH FOR USE IN RF FIELDS

(75) Inventors: Bernhard Gleich, Hamburg (DE); Peter Vernickel, Hamburg (DE); Steffen Weiss, Hamburg (DE); Kai-Michael Luedeke, Halstenbek (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 462 days.

(21) Appl. No.: 11/721,175

(22) PCT Filed: Dec. 15, 2005

(86) PCT No.: PCT/IB2005/054267

§ 371 (c)(1),
(2), (4) Date: Jun. 8, 2007

(87) PCT Pub. No.: WO2006/067703

PCT Pub. Date: Jun. 29, 2006

(65) Prior Publication Data

US 2009/0251236 A1    Oct. 8, 2009

(30) Foreign Application Priority Data

Dec. 20, 2004  (EP) .................................. 04106735

(51) Int. Cl.
*H01P 3/08* (2006.01)
*H01P 5/00* (2006.01)

(52) U.S. Cl. ..................................... 333/24 R; 333/246

(58) Field of Classification Search ............... 333/24 R, 333/24 C, 125, 127, 128, 136, 236, 237, 238, 333/246

See application file for complete search history.

(56) References Cited

U.S. PATENT DOCUMENTS

| | | | | |
|---|---|---|---|---|
| 248,742 | A  * | 10/1881 | Henck, Jr. ................... | 361/330 |
| 6,496,006 | B1 | 12/2002 | Vrijheid | |
| 7,102,470 | B2 * | 9/2006 | Chang et al. ................ | 333/204 |
| 7,205,768 | B2 * | 4/2007 | Schulz et al. ............... | 324/322 |

(Continued)

FOREIGN PATENT DOCUMENTS

| | | |
|---|---|---|
| WO | 9919739 A1 | 4/1999 |
| WO | 2004038443 A1 | 5/2004 |
| WO | 2005103748 A1 | 11/2005 |

OTHER PUBLICATIONS

Bartels, L. W., et al.; Endovascular interventional magnetic resonance imaging; 2003; Phys. Med. Biol.; vol. 48; pp. R37-R64.
Weiss, S., et al.; Transmission Line for Improved RF Safety of Interventional Devices; 2005; Magnetic Resonance in Medicine; 54:182-189.

*Primary Examiner*—Dean O Takaoka

(57) ABSTRACT

A transmission path (13) for transmitting high frequency (RF) signals is disclosed, which comprises a plurality of lead segments (20, 21, 22) which are coupled to one another on one end by a capacitive coupling element (30) and on the other end by an inductive coupling element (31) and which each have an effective length of approximately $\lambda_i/4$, wherein $\lambda_i$ is the wavelength of a differential mode signal to be transmitted over the path (13). By providing these element (30, 31) in the form of distributed elements which electrically extend over at least a part of adjacent lead segments (20, 21; 21, 22) a very thin transmission path (13) can be realized, which is especially suitable for use with invasive catheters. Furthermore, this path (13) can be guided through RF fields of a magnetic resonance (MR) imaging system because common mode resonances are effectively suppressed.

17 Claims, 4 Drawing Sheets

U.S. PATENT DOCUMENTS

2002/0013525 A1 1/2002 Scott
2002/0095084 A1 7/2002 Vrijheid et al.
2002/0109503 A1 8/2002 Kestler et al.
2004/0217761 A1 11/2004 Wong et al.

* cited by examiner

TRANSMISSION PATH FOR USE IN RF FIELDS

BACKGROUND

The invention relates to a transmission path (conductive link or connection lead or line) for transmitting high frequency (RF) signals, which is especially suitable for use with invasive catheters. Furthermore, this path can be provided for guiding through RF fields especially of a magnetic resonance (MR) imaging system. The invention as well relates to an electrical device, like especially a catheter or another invasive or accessory device for the examination of a human body especially during MR imaging. Finally, the invention relates to a magnetic resonance imaging system, comprising one or more electrical accessory devices such as, for example, RF surface coils or catheters with coil elements which are provided with a RF transmission path.

A MR imaging system is used in particular for the examination and treatment of patients. By such a system, the nuclear spins of the body tissue to be examined are aligned by a steady main magnetic field ($B_0$ field) and are excited by RF pulses ($B_1$ field). The resulting relaxation signals are exposed to gradient magnetic fields for the purpose of localization and are received in order to form in a known manner therefrom a one-, two- or three-dimensional image of the body tissue.

Essentially two types of MR systems can be distinguished. The first one is the so-called open MR system (vertical system) in which a patient is introduced into an examination zone which is situated between the ends of a C-arm. The patient is accessible during the examination or treatment from practically all sides. The second one is a MR system which comprises a tubular (cylindrical) examination space (axial system) into which the patient is introduced.

RF coil systems are provided for the transmission of the RF signals and the reception of the relaxation signals. In addition to the RF coil systems which are permanently built into the MR imaging apparatus (body coils for imaging substantially the whole body of a patient), use is also made of RF surface coils which can be flexibly arranged, for example, as a sleeve or pad around or in a specific region to be examined. Similarly, RF head coils are provided and adapted for the examination of a head of a patient.

Furthermore, use is made of catheters or other invasive devices which are introduced into the patient, for example, in order to take a sample of tissue during the MR imaging and which comprise at least one coil element, an oscillator or the like at least at the area of their tip for the purpose of localization in the image formed or for the purpose of imaging.

RF transmission lines or paths for connecting accessory devices like these RF surface coils, head coils and catheters, as well as other devices as mentioned above, with a connection unit, notably a power supply, a receiving device and/or a control unit, usually have to be guided through RF fields which in the case of an MR system is especially the $B_1$ field, generated in the form of said RF pulses which are transmitted by means of the RF coil system.

Such RF fields induce RF common mode signals (currents) in the RF transmission line and in the surrounding body tissue. These currents involve not only the risk of disturbances or destruction of the accessory device and/or the connection unit, but notably can give rise to substantial heating of the line and directly of the adjacent tissue and, especially in the case of surface coils and catheters, to burning of the patient when the RF transmission line is too close to or within the patient. Consequently, such lines have to be made safe with respect to these risks.

DE 102 49 239.5 and PCT/IB03/04589 disclose a connection lead comprising at least one line section with a length of unequal $n*\lambda/2$ ($\lambda$=wavelength of the RF pulses) which is limited by an inductive coupling element, especially a transformer. By this, the line section is non-resonant for common mode signals, which are induced by transmitted RF pulses ($B_1$ field). Preferably, the inductive coupling element is connected with at least one capacitive element to form a resonant circuit, the resonance condition of which being satisfied for the frequency of a signal (i.e. the differential mode signal generated by the MR relaxation events) to be transferred over the connection lead.

This connection lead can be applied to make interventional instruments as intravascular catheters RF-safe for use in MR-guided interventions.

However, a first disadvantage of this connection lead is the fact that the resonators and especially the discrete capacitive and inductive element(s) need extra space which results in a diameter and/or thickness of the lead which makes its use in catheters and/or for introduction into a human body virtually impossible. A second disadvantage is that the resonators may couple to each other and therefore become inefficient. A third disadvantage is that the resonators as such may cause heating of the surrounding tissue.

SUMMARY

Therefore it is an object of the invention to provide a transmission path as mentioned in the introductory part by which at least one of the above mentioned three disadvantages can at least substantially be removed or avoided.

Furthermore, a transmission path as mentioned in the introductory part shall be provided which is safe in the sense above when guided through RF fields and which can be manufactured at low cost and with long lengths, especially for use with disposable catheters or other invasive devices.

Finally, a transmission path as mentioned in the introductory part shall be provided, which is safe in the sense above when guided through RF fields and which has a minimum loss and a high transmission quality for the signals to be transmitted.

In accordance with one aspect, a transmission path comprises at least two lead segments which are coupled by at least one inductive and/or capacitive coupling element which is provided in the form of a distributed circuit element which electrically extends over at least a part of adjacent lead segments.

By providing such a distributed element, the RF transmission path can be realized as a very thin, long and narrow line, especially if manufactured in the form of a printed circuit board on a flexible carrier or substrate, so that it can be used in catheters for invasive examinations of a human body.

Furthermore it can be manufactured at low cost, because no separate discrete or lumped elements are necessary.

By an alternating capacitive and inductive coupling of the lead segments and preferably an effective length of the lead segments of approximately $\lambda_i/4$ according to claim 5, a $\lambda_i/4$ transformer resonance ($\lambda_i$=wavelength within the lead segment) can be achieved in such a way that a resonance is excited only for the differential mode signals to be transmitted while common mode signals are suppressed. By this, a transmission path with a transfer function can be achieved which is optimized for the transmission of differential mode signals in the MR frequency range and which is non-resonant and effectively suppressing common mode signals.

Another considerable advantage is the fact that such a transmission path can as well be used for connecting implants especially with long conductors or electrodes, like for example heart pacemakers or artificial nerves, for supplying power to preamplifiers, for MR compatible IVUS (intra vascular ultra sound) devices, for multieye tracking of catheters or guide wires during MR image generation, and other applications which require a RF transmission path which not only has a very small diameter but is also safe in the above sense when guided through a RF field (for example generated by a MR imaging system).

Further details, features and advantages of the invention will become apparent from the following description of preferred embodiments which is given with reference to the drawings, in which is shown in:

DETAILED DESCRIPTION

Figure 1A:
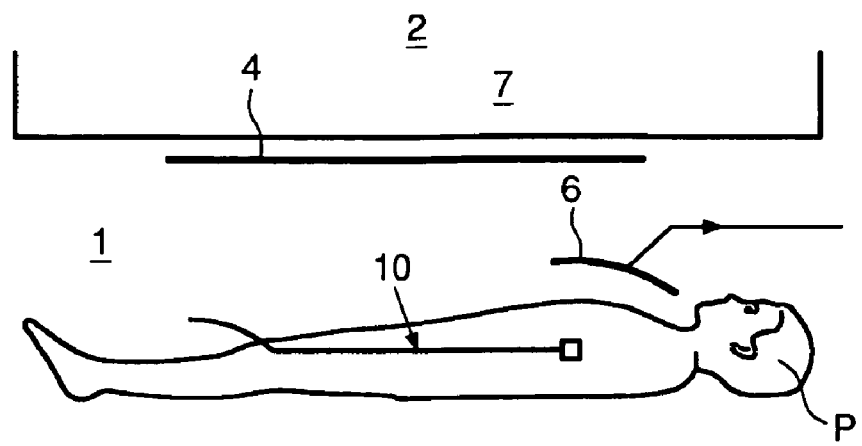
FIG. 1 a diagrammatic side elevation of an MR imaging apparatus and of an accessory device.
Figure 1A:
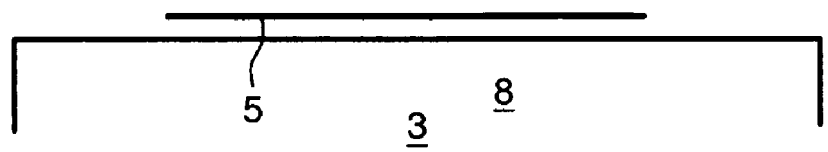
Figure 1A:
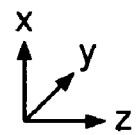

FIG. 1A exemplarily shows components of an open MR imaging apparatus which are of essential importance for the generation and reception of magnetic fields in an examination zone 1. Above and underneath the examination zone 1 there are provided respective magnet systems 2, 3 which generate an essentially uniform main magnetic field ($B_0$ field for magnetizing the object to be examined, that is, for aligning the nuclear spins) whose magnetic flux density (magnetic induction) may be in the order of a magnitude of between some tenths of Tesla to some Tesla. The main magnetic field essentially extends through a patient P in a direction perpendicular to the longitudinal axis of the patient (i.e. in the x direction).

Planar or at least approximately planar RF conductor structures (resonators) in the form of RF transmission coils 4 ("body coils") are provided for generating RF pulses ($B_1$ field) of the MR frequency whereby the nuclear spins are excited in the tissue to be examined, said RF transmission coils 4 being arranged on the respective magnet systems 2 and/or 3. RF receiving coils 5 are provided for receiving subsequent relaxation events in the tissue; these coils 5 may also be formed by RF conductor structures (resonators) provided on at least one of the magnet systems 2, 3. Alternatively, one common RF resonator can also be used for transmission and reception if it is suitably switched over, or the two RF resonators 4, 5 can serve for the alternating transmission and reception in common.

Furthermore, for the spatial discrimination and resolution of the relaxation signals emanating from the tissue of a patient P (localization of the excited states) there are also provided a plurality of gradient magnetic field coils 7, 8 whereby three gradient magnetic fields are generated which extend in the direction of the x axis. Accordingly, a first gradient magnetic field varies essentially linearly in the direction of the x axis, while a second gradient magnetic field varies essentially linearly in the direction of the y axis, and a third gradient magnetic field varies essentially linearly in the direction of the z axis.

Electrical accessory devices or auxiliary equipments are required for certain examinations. Such devices are, for example, RF surface coils 6 which are used in addition to or as an alternative for the planar RF receiving body coils 5 and which are arranged as RF receiving coils directly on the patient P or the zone to be examined. These RF surface coils 6 are generally constructed as flexible pads or sleeves.

Furthermore, in order to carry out the treatment of the patient P or to extract a tissue sample or to determine tissue parameters, use is often made of a catheter 10 which is introduced into the patient and whose position is to be visualized on a display screen. Various active methods and passive methods (WO 99/19739) as well as global and local detection or tracking strategies are known for this purpose (see: Bartels and Bakker in "Endovascular interventional magnetic resonance imaging", Institute of Physics Publishing, Phys. Med. Biol. 48 (2003) R37-R64).

Figure 1B:
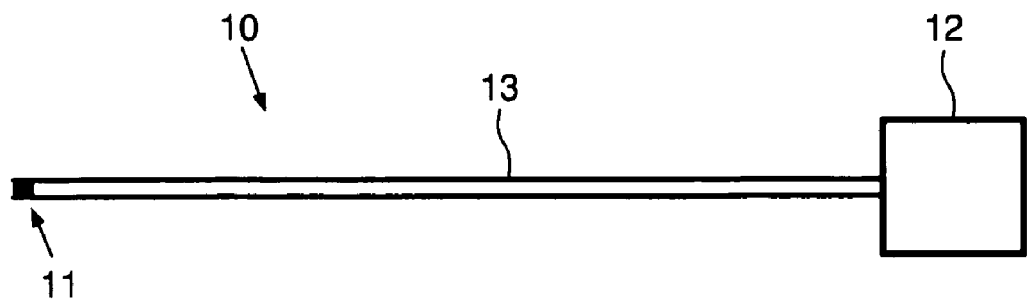

FIG. 1B shows a diagrammatic representation of such an accessory device in the form of a catheter 10. On the tip of the catheter (or in a location at a slight distance therefrom) there could be arranged a transmission and/or receiving unit 11, for example, in the form of a microcoil or a microchip on which the necessary components like a coil (and possibly also sensors) are realized, or the tip is provided with sensors or other means according to the prior art. At the end of the catheter 10 which is situated outside the patient P a connection unit 12 is provided in the form of a power supply unit and/or a receiving device and/or a control device and/or a switching unit which is connected via a RF transmission path 13, which is guided through the catheter, to the transmission and/or receiving unit 11 and via which the transmission and/or receiving unit 11 is activated and possibly the measuring values and data from sensors or other components are transmitted.

In the case of an accessory device in the form of RF surface coils 6, such coils are also connected, via a RF transmission path 13 (conductive link or connection lead) to a corresponding connection unit 12 (power supply, receiving/transmitting device and/or control device) for transmitting the received MR relaxation signals (differential mode signals).

As mentioned in the introductory part, the RF fields generated by the RF coil system however induce RF common mode currents in the transmission path 13 (or sheath currents in case of coaxial cables) which result in a heating of the path due to local high current densities and in heating of the surrounding tissue due to local high electric fields. These standing waves surround the path 13 as a whole so that it works as one antenna wire.

Considering this problem, it has generally to be distinguished between the wavelength within the path 13 ($\lambda_i = \lambda_0 / \sqrt{\in_i}$) and the wavelength outside the path 13 ($\lambda_a = \lambda_0 / \sqrt{\in_a}$) wherein $\lambda_0$ is the wavelength in a vacuum, $\in_i$ is the effective dielectric constant within the path 13 or between the wires of the path and $\in_a$ is the effective dielectric constant outside the path 13, more precisely also called differential (or odd) mode dielectric constant $\in_i$ and common (or even) mode effective dielectric constant $\in_a$, respectively.

Generally, such common mode currents can be suppressed or avoided e.g. by introducing lead segments with a length of smaller than $\lambda_a/4$ which are coupled by inductors/transformers and capacitors as disclosed in DE 102 49 239.5 and PCT/IB03/04589.

As an alternative, a RF transmission path can be made safe with respect to these common mode currents by subdividing it into two or more short lead segments, which are coupled to one another via an inductive coupling element and a matching network comprising capacitors and/or inductors in lumped element form.

However, in both these and other cases, these discrete components need extra space and limit the use of such paths in catheters to large diameter vessels.

As a general principle of the invention, instead of using discrete or lumped elements, such coupling elements are provided in the form of capacitors and/or inductors/transformers which are electrically distributed over at least a part of the transmission path 13.

In the following the invention is explained in more details with reference to embodiments in the form of RF transmission paths, which are provided for the transmission of RF signals. If on one end of the RF transmission path a transmission and/or receiving unit 11 or another accessory device is provided which has to be supplied with power, such power can be transmitted over the RF transmission path in the form of RF power which is rectified and accordingly converted at the unit or device to be supplied. For this power transmission, other frequencies within the transmission bandwidth of the path can be used and/or the power is transmitted during time intervals in which no differential mode signal is transmitted.

Figure 2:
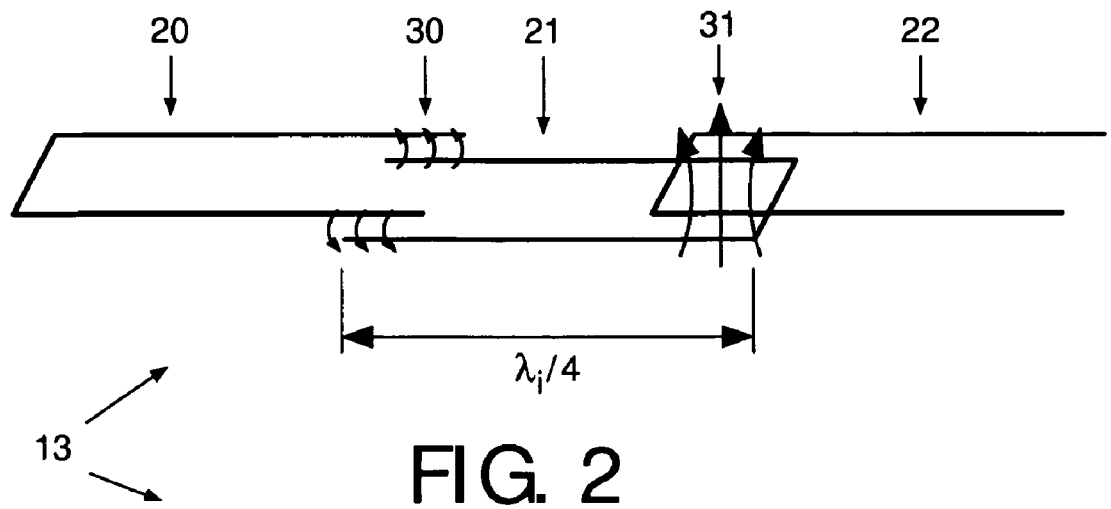
FIG. 2 a first embodiment of a RF transmission path according to the invention.

FIG. 2 shows a portion of a first embodiment of a RF transmission path according to the invention, comprising three lead segments 20, 21, 22 which are realized in the form of two wires which each have an effective length of at least substantially $\lambda_i/4$ (wherein $\lambda_i$ is the wavelength of the differential mode signal within the path 13, which is to be transmitted over the path 13) or slightly less than $\lambda_i/4$. Electrically distributed coupling elements 30, 31 are e.g. achieved by providing an overlap between adjacent lead segments 20, 21; 21, 22.

Figure 3:
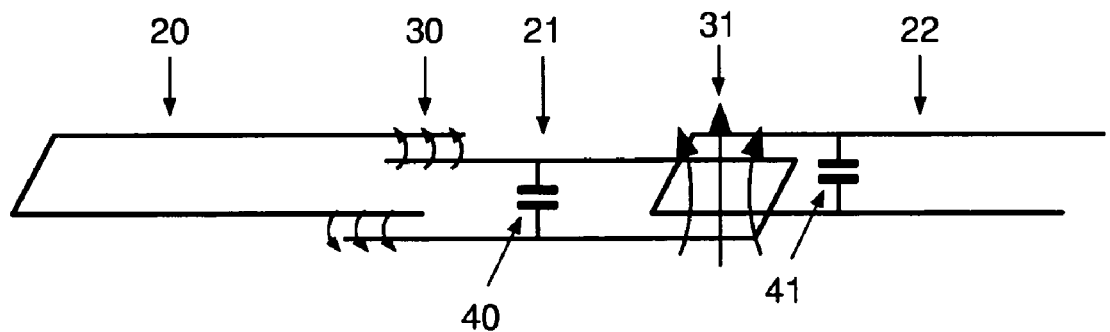
FIG. 3 a second embodiment of a RF transmission path according to the invention.

More in detail, according to FIGS. 2 and 3, a distributed capacitor 30 is realized by overlapping open ends of the wires of adjacent lead segments 20, 21, and a distributed transformer 31 is realized by overlapping closed or short-circuit ends (loops) of the wires of adjacent lead segments 21, 22.

If such a RF transmission path 13 is provided in the form of a printed circuit board on a flexible carrier or substrate, it can be realized as a very thin and narrow line and can be used in catheters for invasive examinations of a human body.

By providing alternating capacitive and inductive couplings of adjacent lead segments 20, 21, 22, each having a length of at least substantially $\lambda_i/4$ (or slightly less than $\lambda_i/4$), such that each lead segment 20, 21, 22 including the inductive and capacitive coupling elements 30, 31 is $\lambda_i/4$ resonant, only a resonance for the differential mode signal to be transmitted ($\lambda_i/4$-transformer resonance with a current maximum at the inductive coupling element 31 ($L_k$) and a voltage maximum at the capacitive coupling element 30 ($C_k$)) is excited while common mode resonances are suppressed by the high series impedances of the (low stray) capacitances at the ends of the lead segments and by the fact that the lead segments are too short for a common mode standing wave.

By an appropriate dimensioning of the overlappings, a desired band pass transmission characteristic can be achieved for the differential mode signal to be transmitted.

Depending upon the proposed application and the frequency range to be transmitted, a problem may arise with respect to the relatively long length of the lead segments 20, 21; 22 because they are to be dimensioned to an effective length of about $\lambda_i/4$ as mentioned above. Accordingly, for a given (relatively short) length of the whole transmission path 13, there may be too few subdivisions (couplings) in the path 13 to suppress or shift the common mode resonance frequency sufficiently high.

This problem can be solved according to FIG. 3 which shows a portion of a second embodiment of a RF transmission path according to the invention, by adding each a parallel capacitor 40, 41 between the wires of the lead segments 21, 22, 23.

In order to not increase the diameter of the transmission path substantially, these capacitors 40, 41 can be realized by multiple discrete capacitor elements or in electrically distributed form by overlapping wire structures e.g. near the inductive coupling elements 31 or distributed over the total wire. It is also possible to have a smoothly varying capacitance.

An additional or alternative measure is to use a material with a high dielectric constant $\in_i$ within the lead segments 20, 21, 22 and/or between the individual wires in the wire pairs of the lead segments 20, 21, 22 and/or a low separation of (a decreased distance between) the individual wires in the wire pairs of the lead segments 20, 21, 22.

All this reduces the wavelength $\lambda_i$ within the lead segments 20, 21, 22 and consequently the resonant length of the lead segments 20, 21, 22 for the differential mode signals so that more couplings 30, 31 have to be provided for the same external length of the RF transmission path. Simultaneously, because of the now decreased actual length of the lead segments they become more non-resonant for common mode signals.

As another additional or alternative measure, if the actual length of the lead segments 20, 21, 22 is decreased, the resonance for the differential mode signal can be kept at least substantially unchanged if the inductivity of the inductive coupling elements 31 is accordingly increased.

Another additional or alternative measure is to use a material in which the wires of the lead segments 20, 21, 22 are embedded with a dielectric constant $\in_a$ as low as possible to increase the outer half wavelength $\lambda_a/2$ of the lead segments 20, 21, 22 which is effective for the common mode signals, so that it is kept much higher than the common mode resonant length of the lead segments 20, 21, 22.

There are different ways to manufacture such a RF transmission path or cable 13. The most versatile method is to use a PCB (printed circuit board) approach.

Another method is to use two pairs of wires (i.e. 4 conductors) and wind them in helical shape. In order to achieve the structure as shown in FIG. 2, the pairs of wires are each cut with an offset to each other so that overlapping open ends (couplings 30) between the wire pairs are provided. Furthermore, the wires of each pair are each connected with an offset to each other so that overlapping closed ends (couplings 31) between the wire pairs are achieved. The distance between each cutting and connecting (i.e. the couplings 30, 31) is selected such that lead segments 20, 21, 22 with a length of each $\lambda_i/4$ are achieved.

Another alternative is to use connected wires in the form of long loops and to cut them into lead segments with a length of each $\lambda_i/4$.

The capacitive coupling 30 is not necessarily performed by (direct) coupling of the open ends of the loops as shown in FIGS. 2 and 3. According to the side view of FIG. 4, the open ends of adjacent lead segments 50, 51 which are lying in the same plane can (indirectly) be coupled each via a short length of wire 52 which is placed just above opposing ends of the lead segments 50, 51. This increases the flexibility of the manufacturing parameters if only wire cutting is used.

Preferably, a flexible substrate or carrier is used for carrying the wires, which results in a very thin line or cable 13 which is especially suited for application in catheters.

All the above-described principles are not limited to two-wire transmission paths but can be applied to coaxial cables as well.

Figure 4:
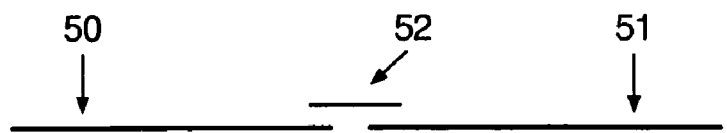
FIG. 4 a coupling element for adjacent wires of a RF transmission path.

The portions of the RF transmission paths according to FIGS. 2, 3 and 4 can of course be continued on both sides with each a plurality of further segments 20, 21, 22; 50, 51.

Simulations were performed to evaluate the feasibility of the proposed concepts for a catheter 10 with a microcoil 11 with an inductivity L of about 150 nH at its tip to be used in a 1.5 T MR system (signal frequency=63.87 MHz). In these simulations the line or path 13 comprises three segments 20, 21, 22 with a length of each about 0.66 m with an overlap of adjacent segments of about 0.04 m. Each segment 20, 21, 22 comprises two copper rods with a diameter d of about 50 µm, a distance of about 500 µm and a dielectric constant $\in_i$ between the rods of about 2.2. This results in a wavelength $\lambda_i/4$ of about 0.79 m. For this path, a signal attenuation of about 15 dB was simulated (differential mode). However, the common mode resonant frequency of this path is about 63 MHz.

Consequently, the common mode resonance must be increased to as far as possible above 63.87 MHz to avoid the excitation of this resonance during RF transmission of the MR system. Therefore, the effective length of the lead segments must be reduced. At the same time, the differential mode resonant frequency must be kept at 63.87 MHz for low loss signal transmission. This can be achieved e.g. with at least one of the following three measures mentioned above in connection with the second embodiment and FIG. 3:

1.) a higher dielectric constant $\in_i$ between the rods, and/or

2.) a decrease of the distance between the leads 20, 21 near the open ends, and/or 3.) a (lumped or multiple discrete or distributed) capacitor 40, 41 near the open ends of the segments.

Figure 5:
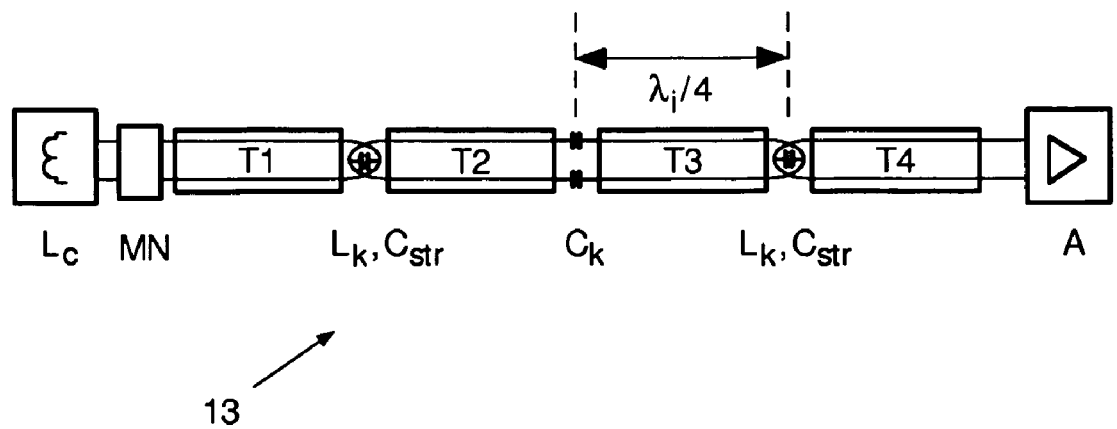
FIG. 5 an equivalent circuit diagram of a RF transmission path comprising lead segments and coupling sections.

FIG. 5 shows a schematic equivalent circuit diagram of a resonant RF transmission path 13 comprising four lead segments T1, T2, T3 and T4 with a length of each at least substantially $\lambda_i/4$ which are coupled alternatingly via a capacitive coupling $C_k$ and an inductive coupling $L_k$ as explained above with reference to FIG. 2. In practice, the capacitive coupling is effective as $C_k/2$ in differential mode and as $2C_k$ in common mode. Furthermore, the inductive coupling $L_k$ comprises in practice a stray capacitance $C_{str}$ which is schematically indicated as well.

An accessory device like a microcoil Lc on the tip of a catheter is coupled via an appropriate matching network MN with one end (input) of the RF transmission path 13. The matching network MN is provided for matching the impedance of the accessory device to the RF transmission path 13. On its other end (output), the RF transmission path 13 is coupled e.g. with a high impedance FET amplifier A or a transformer for transforming the impedance and evaluation signals which are transmitted over the RF transmission path 13.

Figure 6:
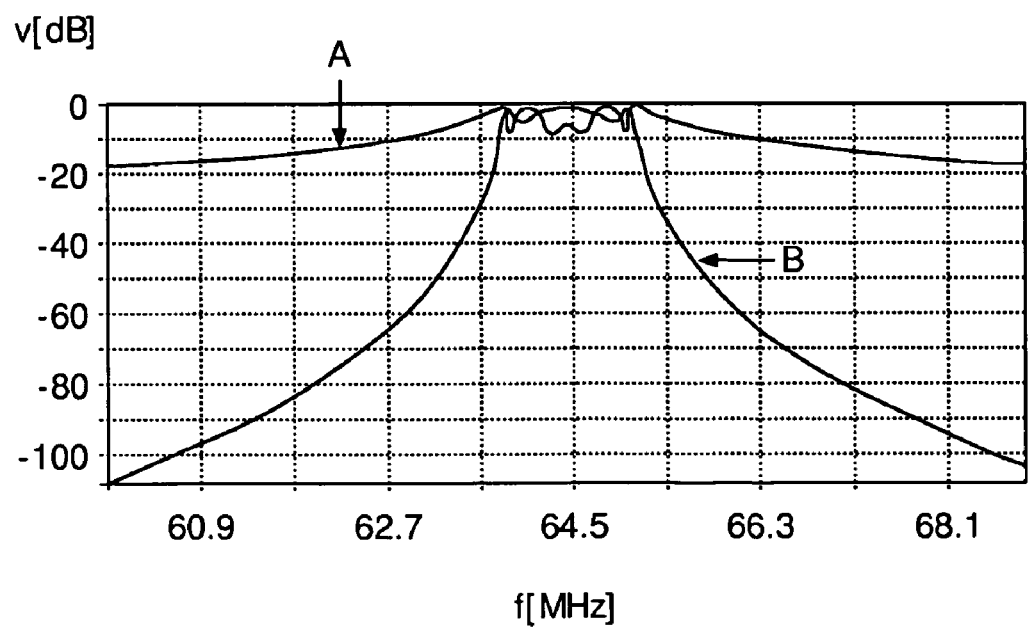
FIG. 6 the transmission characteristic of a RF transmission path without loss.

FIG. 6 shows an exemplary transmission/frequency characteristic which can be achieved with such a RF transmission path 13, if the length of the lead segments T1, T2, T3, T4, the capacitive coupling $C_k$, the inductive coupling $L_k$ and the matching network MN are optimized. Under the assumption that the lead segments T1, T2, T3, T4 have no loss, curve A indicates the voltage v [dB] induced in the microcoil Lc and curve B indicates the voltage v [dB] at the output of the RF transmission path 13, each in dependence of the frequency f [MHz].

Figure 7:
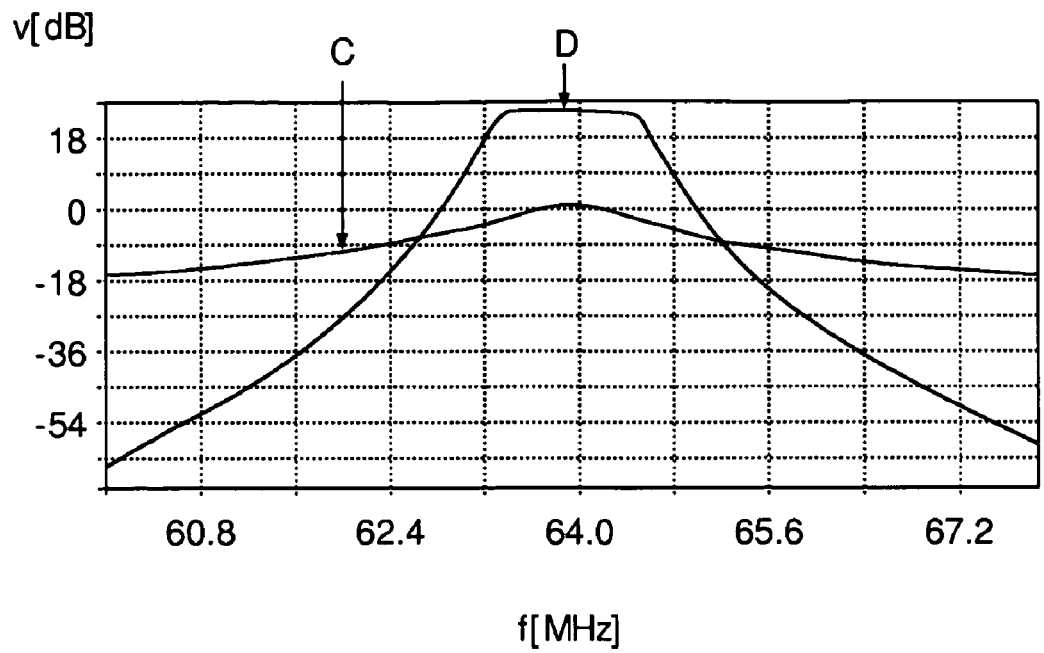
FIG. 7 the transmission characteristic of a RF transmission path with loss.

In comparison to this, FIG. 7 shows such a transmission characteristic under consideration of the loss of the lead segments T1, T2, T3, T4 and in case that they are provided in the form of RG174 coaxial cables. Curve C is again the voltage v [dB] induced in the microcoil Lc and curve D is the voltage v [dB] at the output of the RF transmission path.

Figure 8:
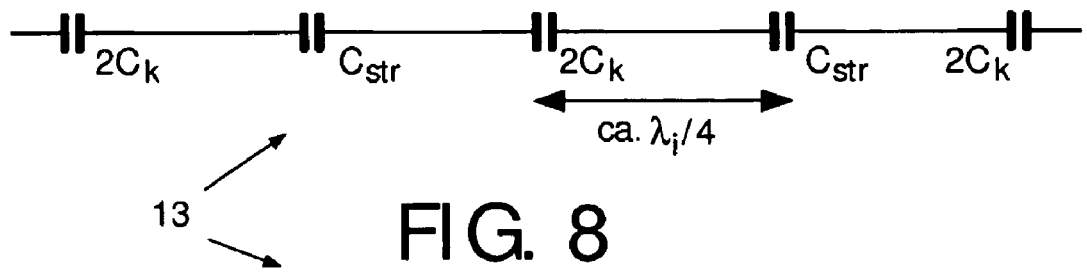
FIG. 8 an equivalent circuit diagram of the RF transmission path regarding common mode signals.

FIG. 8 shows an equivalent circuit diagram of the RF transmission path 13 considering its characteristic for common mode signals. For these signals, the RF transmission path 13 is effective as one single wire which is interrupted for common mode signals by the coupling capacitors $2C_k$ and the stray capacitances $C_{str}$ of the inductive coupling $L_k$ at intervals of about $\lambda_i/4$.

If the outer wavelength $\lambda_a$ is not shorter than the inner wavelength $\lambda_i$, the separation of the RF transmission path 13 into lead segments with a length of about $\lambda_i/4$ is in most cases sufficient to effectively suppress any dangerous common mode signals. However in case of certain applications like for example at the surface of a body tissue or in case of a catheter which is introduced into a human body, the higher dielectric constant of the body tissue has the effect that the outer dielectric constant $\in_a$ which is effective for the common mode signals is considerably larger than the inner dielectric constant $\in_i$ of the RF transmission path so that the wavelength $\lambda_a$ of the common mode signals becomes smaller than the wavelength $\lambda_i$ within the transmission path.

By at least one of the following two measures (third and fourth embodiment) the effective length of the lead segments can be kept substantially below the critical length $\lambda_a/2$ for the common mode signals as well.

Figure 9:
FIG. 9 a folded lead segment of a RF transmission path.

According to a third embodiment as shown in FIG. 9 at least one lead segment (in this case in the form of a coaxial cable) is folded to a length of one third of the unfolded length. By this, as long as the outer dielectric constant $\in_a$ remains smaller than or equal to $9*\in_i$, the electrically effective length of the lead segment would not be longer than $\lambda_a/4$.

The folding of the lead segments according to FIG. 9 can for example be realized by using a PCB multi-layer technique with shielding intermediate layers.

In case of a symmetrical two-wire line and other types of transmission lines or paths it has to be taken care that the above-mentioned function of the line is not impaired by the folding. Furthermore, the adjacent and parallel lying parts of each lead segment may not couple with each other and the shielding must be effective as an accordingly shortened wire segment.

According to a fourth embodiment, the actual length of the lead segments 20, 21, 22 is decreased according to the shorter wavelength $\lambda_a/4$ of the common mode signal. For maintaining the resonance condition for the differential mode signals, the inductivities 31 coupling the lead segments 21, 22 are increased so far that the lead segments together with the capacitors 40 or 41 between the wires of the lead segments as shown in FIG. 3 are again resonant for the differential mode signals.

These embodiments have the advantage that it is not necessary to have a great number of transformers with a high coupling factor. The above embodiments require a coupling factor of only about 8% with respect to the inductive coupling loops. Furthermore, the capacitance of the coupling capacitors is as well relatively small like for example 1 pF ($C_k$) in both wires of the circuit diagram according to FIG. 5.

The RF transmission path 13 can for example be realized as a shielded two wire line in the form of a printed circuit board (PCB) comprising lead segments on both sides of a flexible substrate. The overlapping loops as well as the overlapping open ends between the adjacent lead segments can be realized by an overlapping of only a few centimeters each.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof

The invention claimed is:

1. A transmission path comprising at least two lead segments which are coupled by at least one inductive and/or capacitive coupling element which is provided in the form of a distributed circuit element which electrically extends over at least a part of adjacent lead segments, the lead segments being coupled to one another on one end by a primarily capacitive coupling element and on the other end by primarily inductive coupling element or a transformer element.

2. The transmission path according to claim 1, wherein the distributed inductive coupling element or a transformer element is realized in the form of overlapping closed or short-circuited ends of each two wires of adjacent lead segments.

3. The transmission path according to claim 1, wherein the distributed capacitive coupling element is realized in the form of overlapping open ends of each two wires of adjacent lead segments.

4. The transmission path according to claim 1, wherein a length of at least one of the lead segments is selected to increase a common mode resonance frequency and a capacitance of the primarily capacitive element is sized to keep a differential mode resonance frequency substantially unchanged.

5. The transmission path according to claim 4, wherein the lead segments each have an effective length of approximately (or slightly less than) $\lambda_i/4$, such that each lead segment including the inductive coupling element/transformer and the primarily capacitive coupling element is $\lambda_i/4$-resonant, wherein $\lambda_i$ is the wavelength of the differential mode signal to be transmitted over the path.

6. The transmission path according to claim 4, wherein the primarily capacitive coupling element includes a capacitor disposed between two wires of the lead segment in order to keep the differential mode resonant frequency at least substantially unchanged.

7. The transmission path according to claim 1, wherein an actual length of at least one of the lead segments is sized to increase a common mode resonant frequency, and wherein a dielectric material is provided between wires of the lead segments with a dielectric constant $\in_i$ which is selected such that a differential mode resonant frequency remains at least substantially unchanged.

8. The transmission path according to claim 1, wherein the actual length of at least one of the lead segments is selected to increase a common mode resonant frequency, and wherein a distance between wires of the lead segments near open ends of the lead segments is selected such that a differential mode resonant frequency remains at least substantially unchanged.

9. The transmission path according to claim 1, wherein at least one of the lead segments is covered with a dielectric material with such a dielectric constant $\in_a$ that the lead segment is non-resonant for common mode signals.

10. An electrical accessory device comprising a transmission path according to claim 1, for connecting the electrical accessory device or auxiliary equipment with a connection unit in a magnetic resonance imaging system.

11. A magnetic resonance (MR) imaging system comprising an electrical accessory device comprising a transmission path comprising a plurality of lead segments, each lead segment being primarily capacitively coupled to a first adjoining lead segment at a first end and primarily inductively coupled to a second adjoining lead segment at a second end.

12. The transmission path according to claim 11, wherein the lead segments each have an effective length of approximately (or slightly less than) $\lambda_i/4$, such that each lead segment including the inductive coupling element/transformer and the capacitive coupling element is $\lambda_i/4$-resonant, wherein $\lambda_i$ is the wavelength of a differential mode signal to be transmitted over the path.

13. The transmission path according to claim 11, wherein an actual length of at least one of the lead segments is selected to increase the common mode resonant frequency, and at least one of:
    capacitor elements are disposed between two wires of the lead segment select the different mode resonance frequency,
    a dielectric material is provided between wires of the lead segment with a constant $\in_i$ which is selected such that the differential mode resonant frequency is fixed, and
    at the capacitively coupled ends, wires of the adjoining lead segments are spaced by a selected distance to select the differential mode resonant frequency.

14. The transmission path according to claim 11, wherein at least one of the lead segments is covered with a dielectric material with such a dielectric constant $\in_a$ that the lead segment is non-resonant for common mode signals.

15. An electrical accessory device including a transmission path for connecting the electrical accessory device with a connection unit in a magnetic resonance system, the transmission path comprising:
    at least first, second, and third lead segments, each lead segment having a pair of open ends at one segment end and a closed end at another segment end;
    the first and second lead segments being disposed with the pair of open ends of the first lead segment being disposed adjacent to and capacitively coupled to the pair of open ends of the second lead segment; and
    the second and third lead segments being disposed with the closed end of the second lead segment being disposed adjacent to and inductively coupled to the closed end of the third lead segment.

16. A magnetic resonance system comprising:
    a magnet system which generates a magnetic field in an examination region;
    an RF system which transmits radio frequency signals into the examination region to induce magnetic resonance; and
    the accessory device according to claim 15 disposed at least partially in the examination region.

17. The accessory device according to claim 15, wherein the magnetic resonance system generates signals of a selected frequency and each of the first, second, and third segments has a length less than or equal to a wavelength at the selected frequency.

* * * * *